(12) United States Patent
Ruan et al.

(10) Patent No.: US 9,812,186 B2
(45) Date of Patent: Nov. 7, 2017

(54) REDUCING LATENCY IN AN EXPANDED MEMORY SYSTEM

(71) Applicant: Huawei Technologies Co., Ltd., Shenzhen, Guangdong (CN)

(72) Inventors: Yuan Ruan, Beijing (CN); Mingyu Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 158 days.

(21) Appl. No.: 14/922,973

(22) Filed: Oct. 26, 2015

(65) Prior Publication Data

US 2016/0055898 A1 Feb. 25, 2016

Related U.S. Application Data

(63) Continuation of application No. PCT/CN2014/075068, filed on Apr. 10, 2014.

(30) Foreign Application Priority Data

Apr. 27, 2013 (CN) .......................... 2013 1 0152306

(51) Int. Cl.
*G11C 11/406* (2006.01)
*G06F 12/02* (2006.01)
(Continued)

(52) U.S. Cl.
CPC ........ *G11C 11/40607* (2013.01); *G06F 12/02* (2013.01); *G06F 13/1673* (2013.01); *G11C 7/1063* (2013.01); *G11C 7/1072* (2013.01)

(58) Field of Classification Search
None
See application file for complete search history.

(56) References Cited

U.S. PATENT DOCUMENTS

| 4,644,494 A | * | 2/1987 | Muller | .................. G11C 16/06 |
| | | | | 711/152 |
| 5,760,607 A | | 6/1998 | Leeds et al. | |

(Continued)

FOREIGN PATENT DOCUMENTS

| CN | 101702326 A | 5/2010 |
| CN | 102609378 A | 7/2012 |

(Continued)

*Primary Examiner* — Reginald Bragdon
*Assistant Examiner* — James J Thomas

(57) ABSTRACT

A first level buffer chip gates a target second level buffer chip according to a preset mapping relationship, a first chip select signal, and a first higher-order address signal, and forwards a memory access instruction and a lower-order address signal received from a memory controller to the target second level buffer chip. The target second level buffer chip determines a target memory module according to a second chip select signal and a delayed address signal obtained by delay processing on a second higher-order address signal, determines a target memory chip according to the lower-order address signal, acquires target data from the target memory chip according to the memory access instruction, and returns the target data to the memory controller. A cascading manner of a system memory is changed to a tree-like topological form, which avoids a protocol conversion problem and reduces the memory access time.

8 Claims, 4 Drawing Sheets

(51) Int. Cl.
*G06F 13/16* (2006.01)
*G11C 7/10* (2006.01)

(56) References Cited

U.S. PATENT DOCUMENTS

| | | | | |
|---|---|---|---|---|
| 7,200,062 B2* | 4/2007 | Kinsely | ................. | G11C 11/406 365/189.14 |
| 8,264,903 B1* | 9/2012 | Lee | ................... | G11C 11/40611 365/194 |
| 2008/0002447 A1* | 1/2008 | Gulachenski | ............ | G11C 5/04 365/51 |
| 2008/0056014 A1* | 3/2008 | Rajan | ................. | G06F 13/4243 365/189.03 |
| 2010/0005219 A1 | 1/2010 | Loughner et al. | | |
| 2010/0306440 A1 | 12/2010 | Sauber | | |
| 2012/0059958 A1 | 3/2012 | Hnatko et al. | | |
| 2015/0006841 A1 | 1/2015 | Chen et al. | | |

FOREIGN PATENT DOCUMENTS

KR      20120062714 A    6/2012
WO      2011/008580 A1    1/2011

\* cited by examiner

REDUCING LATENCY IN AN EXPANDED MEMORY SYSTEM

CROSS-REFERENCE TO RELATED APPLICATION

This application is a continuation of International Application No. PCT/CN2014/075068, filed on Apr. 10, 2014, which claims priority to Chinese Patent Application No. 201310152306.4, filed on Apr. 27, 2013, both of which are hereby incorporated by reference in their entireties.

TECHNICAL FIELD

Embodiments of the present invention relate to communication technology, and in particular, to a memory access method and a memory system.

BACKGROUND

A memory system of a computer is one of major factors that affect the system architecture and software effectiveness. Major elements for evaluating performance of a system memory include access delay, bandwidth, and capacity. At present, with the rise of cloud computing and big data, the required data access capacity is increasingly higher.

FIG. 1 is a schematic structural diagram of a prior-art fully buffered dual in-line memory module. As shown in FIG. 1, in a fully buffered dual in-line memory module (Full Buffer Dual Inline Memory Module, FBDIMM for short) chip, an advanced memory buffer chip (Advanced Memory Buffer, AMB for short) is added to a dynamic random access memory (Dynamic Random-Access Memory, DRAM for short), or memory module. The AMB is connected to a memory controller, and therefore the memory module performs data interaction with the memory controller by using the AMB, and no longer performs a direct data interaction with the memory controller. In this mode for expanding a system memory, cascading between memory modules in the system is implemented by using the AMB chip, which increases access capacity of the system memory. Because AMB chips are connected in a series manner, connection between a memory module and another memory module is changed from traditional parallel connection to series connection. However, connection between memory chips inside a memory module is still parallel connection. Therefore, the AMB chip needs to convert series protocol to double data rate (Double Data Rate, DDR for short) for memory access instruction sent by the memory controller, which increases delay time of a memory access. In addition, because the AMB chips are connected in a series manner, a delay for accessing a relatively farther-away memory module is relatively high.

SUMMARY

Embodiments of the present invention provide a memory access method and a memory system to solve the problem that an access delay for accessing a prior-art expanded memory system is relatively high, so as to improve the memory access efficiency of the memory system.

According to a first aspect, an embodiment of the present invention provides a memory access method, including:

sending, by a memory controller, a memory access instruction, a lower-order address signal, a first chip select signal, and a first higher-order address signal to a first level buffer chip, performing delay processing on a second higher-order address signal to obtain a delayed address signal, and sending the delayed address signal to a second level buffer chip, where: the first level buffer chip is cascaded with the second level buffer chip; the second level buffer chip is connected to at least one memory module, where the memory module includes at least one memory chip; the first chip select signal and the first higher-order address signal are used to identify a target second level buffer chip in the second level buffer chip; and the lower-order address signal is used to identify a target memory chip in a target memory module;

outputting, by the first level buffer chip, a second chip select signal to the second level buffer chip according to a preset mapping relationship, the first chip select signal, and the first higher-order address signal to gate the target second level buffer chip, and sending the memory access instruction and the lower-order address signal to the target second level buffer chip, where the second level buffer chip includes at least one buffer chip, and the target second level buffer chip is a buffer chip that is gated by using the second chip select signal and is in the second level buffer chip;

determining, by the target second level buffer chip, the target memory module from the memory module according to the delayed address signal and the second chip select signal, and determining the target memory chip from the target memory module according to the lower-order address signal, where the delayed address signal and the second chip select signal are used to identify the target memory module in the memory module; and acquiring, by the target second level buffer chip, target data from the target memory chip according to the memory access instruction, and sending the target data to the memory controller by using the first level buffer chip.

In a first possible implementation manner of the first aspect, the performing, by the memory controller, delay processing on a second higher-order address signal to obtain a delayed address signal includes:

performing, by the memory controller, delay processing on the second higher-order address signal according to a delay parameter of the first level buffer chip to obtain the delayed address signal.

With reference to the first aspect or the first possible implementation manner of the first aspect, in a second possible implementation manner of the first aspect, the outputting, by the first level buffer chip, a second chip select signal to the second level buffer chip according to a preset mapping relationship, the first chip select signal and the first higher-order address signal to gate the target second level buffer chip includes:

generating, by the first level buffer chip, coding code according to the mapping relationship;

coding, by the first level buffer chip, the first chip select signal and the first higher-order address signal by using the coding code, so as to obtain the second chip select signal; and outputting, by the first level buffer chip, the second chip select signal to the second level buffer chip to gate the target second level buffer chip.

According to a second aspect, an embodiment of the present invention provides a memory system, including: a memory controller, a first level buffer chip, and at least one second level buffer chip, where the memory controller is connected to the first level buffer chip and the second level buffer chip, the first level buffer chip is cascaded with the second level buffer chip, the second level buffer chip is connected to a memory module, and the memory module includes at least one memory chip;

the memory controller is configured to send a memory access instruction, a lower-order address signal, a first chip select signal, and a first higher-order address signal to the first level buffer chip, perform delay processing on a second higher-order address signal to obtain a delayed address signal, send the delayed address signal to the second level buffer chip, and receive target data returned by the first level buffer chip, where the first chip select signal and the first higher-order address signal are used to identify a target second level buffer chip in the second level buffer chip, and the lower-order address signal is used to identify a target memory chip in a target memory module;

the first level buffer chip is configured to receive the memory access instruction, the lower-order address signal, the first chip select signal, and the first higher-order address signal, output a second chip select signal to the second level buffer chip according to a preset mapping relationship, the first chip select signal, and the first higher-order address signal to gate the target second level buffer chip, send the memory access instruction and the lower-order address signal to the target second level buffer chip, receive the target data returned by the target second level buffer chip, and send the target data to the memory controller, where the second level buffer chip includes at least one buffer chip, the target second level buffer chip is a buffer chip that is gated by using the second chip select signal and is in the second level buffer chip; and the target second level buffer chip is configured to receive the memory access instruction, the lower-order address signal, the delayed address signal, and the second chip select signal, determine the target memory module from the memory module according to the delayed address signal and the second chip select signal, determine the target memory chip from the target memory module according to the lower-order address signal, acquire the target data from the target memory chip according to the memory access instruction, and send the target data to the first level buffer chip, where the delayed address signal and the second chip select signal are used to identify the target memory module in the memory module.

In a first possible implementation manner of the second aspect, the memory controller is specifically configured to perform delay processing on the second higher-order address signal according to a delay parameter of the first level buffer chip to obtain the delayed address signal.

With reference to the second aspect or the first possible implementation manner of the second aspect, in a second possible implementation manner of the second aspect, the first level buffer chip is specifically configured to generate coding code according to the mapping relationship; code the first chip select signal and the first higher-order address signal by using the coding code, so as to obtain the second chip select signal; and output the second chip select signal to the second level buffer chip to gate the target second level buffer chip.

With reference to the second aspect or the first possible implementation manner of the second aspect, in a third possible implementation manner of the second aspect, the first level buffer chip is an iMB chip.

According to a third aspect, an embodiment of the present invention provides a memory system, including: a memory controller, a first level buffer chip, and at least one load-reduced dual in-line LRDIMM, where the LRDIMM includes an iMB chip and a memory module, the memory module includes at least one memory chip, the memory controller is connected to the first level buffer chip and the iMB chip in the LRDIMM, and the first level buffer chip is connected to the iMB chip in the LRDIMM.

According to the memory access method and the memory system provided in the embodiments of the present invention, in the embodiments of the present invention, a memory controller is connected to a first level buffer chip and a second level buffer chip, the first level buffer chip is cascaded with the second level buffer chip, and therefore a cascading manner of a system memory is changed to a tree-like topological form; the second level buffer chip can simultaneously receive a signal that is sent by the memory controller and used to select a target memory module and a signal that is sent by the first level buffer chip and used to gate the second level buffer chip, and therefore, for the second level buffer chip, these two signals are no longer received in a series manner, and converting series protocol to parallel protocol is not needed. This avoids a problem that a prior-art expanded system memory needs to convert series protocol to parallel protocol, reduces the time for accessing a memory system, and improves the memory access efficiency of the memory system.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following gives a further detailed description of the technical solutions of the present invention with reference to accompanying drawings and embodiments.

Figure 1:
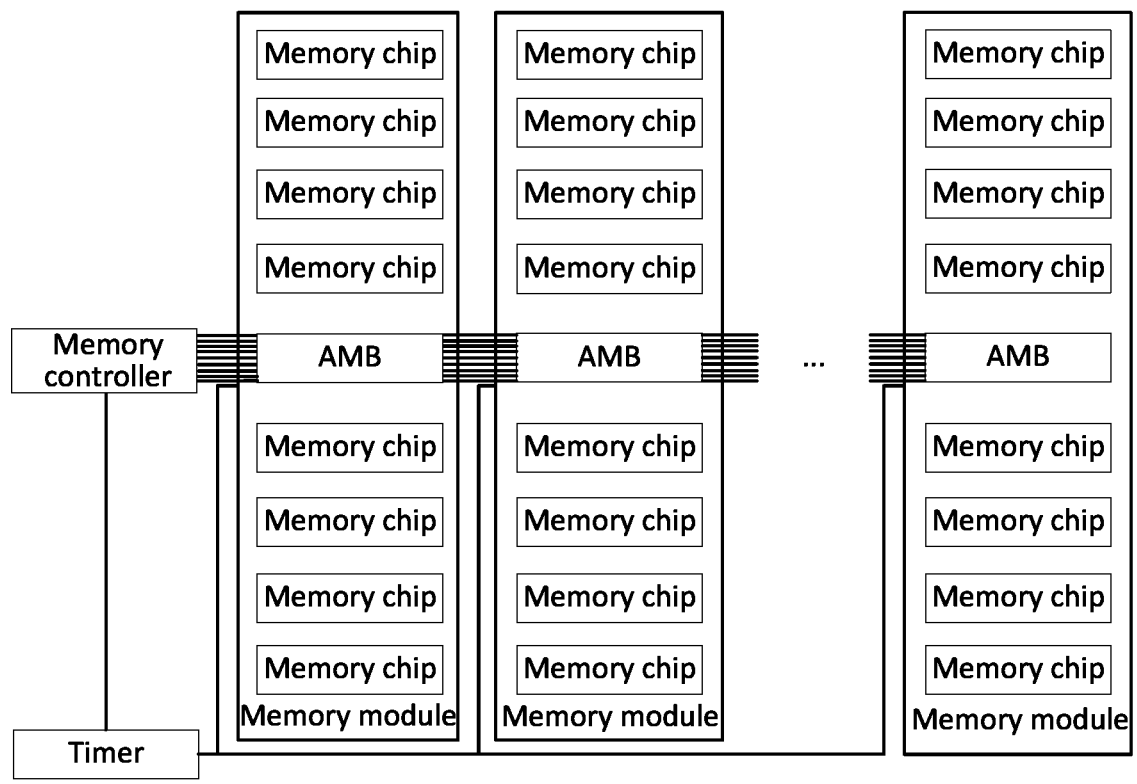
FIG. 1 is a schematic structural diagram of an existing fully buffered dual in-line memory module.
Figure 2:
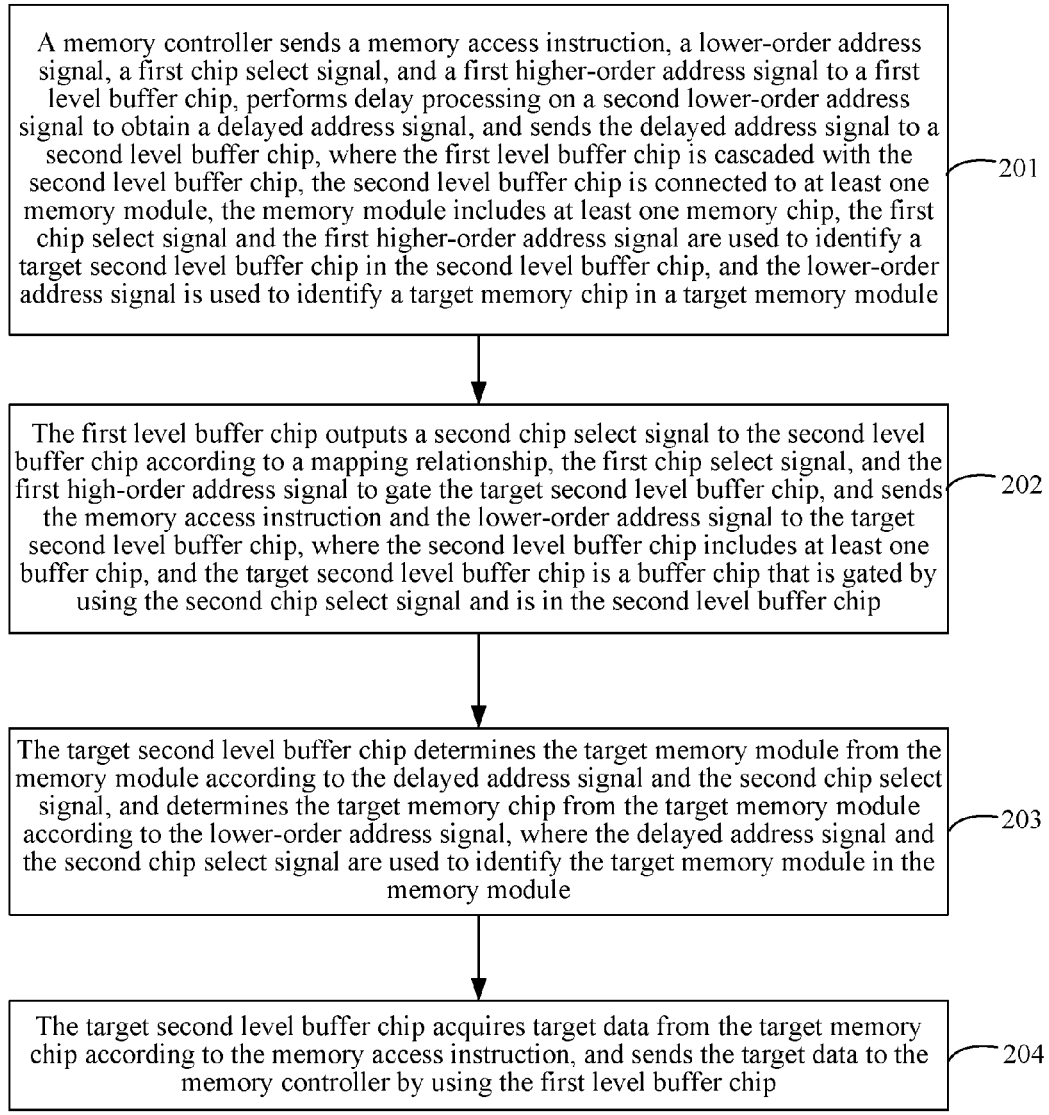
FIG. 2 is a schematic diagram of a memory access method according to an embodiment of the present invention.

FIG. 2 is a schematic diagram of a memory access method according to an embodiment of the present invention. As shown in FIG. 2, the memory access method includes the following steps:

201. A memory controller sends a memory access instruction, a lower-order address signal, a first chip select signal, and a first higher-order address signal to a first level buffer chip, performs delay processing on a second higher-order address signal to obtain a delayed address signal, and sends the delayed address signal to a second level buffer chip, where the first level buffer chip is cascaded with the second level buffer chip, the second level buffer chip is connected to at least one memory module, the memory module includes at least one memory chip, the first chip select signal and the first higher-order address signal are used to identify a target second level buffer chip in the second level buffer chip, and the lower-order address signal is used to identify a target memory chip in a target memory module.

202. The first level buffer chip outputs a second chip select signal to the second level buffer chip according to a preset mapping relationship, the first chip select signal, and the first higher-order address signal to gate the target second level buffer chip, and sends the memory access instruction and the lower-order address signal to the target second level buffer chip, where the second level buffer chip includes at least one buffer chip, and the target second level buffer chip is a buffer chip that is gated by using the second chip select signal and is in the second level buffer chip.

203. The target second level buffer chip determines the target memory module from the memory module according to the delayed address signal and the second chip select signal, and determines the target memory chip from the target memory module according to the lower-order address signal, where the delayed address signal and the second chip select signal are used to identify the target memory module in the memory module.

204. The target second level buffer chip acquires target data from the target memory chip according to the memory access instruction, and sends the target data to the memory controller by using the first level buffer chip.

In this embodiment, two cascaded buffer chips are added between the memory controller and the memory module. The memory controller and the memory module are connected by using the buffer chips. The memory controller is connected to the first level buffer chip and the second level buffer chip. The first level buffer chip is cascaded with the second level buffer chip. The second level buffer chip is connected to the at least one memory module, and the memory module includes the at least one memory chip.

When the memory controller needs to access data stored in the memory module, the memory controller sends the memory access instruction, the lower-order address signal, the first chip select signal, and the first higher-order address signal to the first level buffer chip. The first chip select signal and the first higher-order address signal are used to identify the target second level buffer chip from the second level buffer chip, and the lower-order address signal is used to identify the target memory chip in the target memory module. Actually, the memory controller generally has only 2 to 4 chip select signal lines. In this situation in which the buffer chips are cascaded, generally, the chip select signal lines of the memory controller cannot meet a need for expanding a system memory. Because generally a quantity of address signal lines of the memory controller is greater than that of address signal lines of a buffer chip, a higher-order address signal output by a higher-order address signal line of a memory controller can be used as a chip select signal to implement multi-level cascading of the buffer chip, thereby achieving an objective of expanding the system memory. In this embodiment, a chip select signal (Chip Select, CS for short) output by an actual chip select signal line of the memory controller is used as a first chip select signal. Only one chip select signal line is gated in a group of the chip select signal lines, and usually a low level is used as the chip select signal for gating the buffer chip. For example, in the group of chip select signal lines, a signal output by the only one chip select signal line is "0", and signals output by the remaining chip select signal lines are all "1". In this embodiment, the memory controller selects two chip select signal lines, thus the first chip select signal is two bits, and a value of the first chip select signal is "01" or "10".

Generally, an address signal of a buffer chip is 16 bits. Address signal lines A0 to A15 of the memory controller are connected to address signal lines A0 to A15 of the first level buffer chip. Specifically, the address signal lines A0 to A15 of the memory controller are connected to pins of the address signal lines A0 to A15 of the first level buffer chip. The address signal lines A0 to A15 of the first level buffer chip are connected to pins of address signal lines A0 to A15 of the second level buffer chip. The memory controller uses output of the address signal lines A0 to A15 of the memory controller as the lower-order address signal, and inputs the lower-order address signal to the first level buffer chip, where the lower-order address signal is formed by the output of the address signal lines A0 to A15. A signal output by each address signal line represents a different bit in one address signal. For example, a signal output by the address signal line A0 represents the first bit in the address signal, that is, the lowest-order bit, and a signal output by the address signal line A15 represents the sixteenth bit in the address signal, that is, the highest-order bit. The signal output by each address signal line is "0" or "1". For example, when the memory controller needs to access an address "2", a lower-order address signal that needs to be output is "0000000000000010", that is, an address signal line A1 outputs "1", and the remaining address signal lines A15 to A2 and A0 all output "0".

Further, some address signal lines are selected from the remaining higher-order address signal lines of the memory controller, and output of the selected address signal lines is used as the first higher-order address signal. In this embodiment, the memory controller may select output of two higher-order address signal lines from the remaining higher-order address signals as the first higher-order address signal. For example, the first higher-order address signal may be generated by output of an A17 and an A16 in the remaining higher-order address signal lines. The second bit in the first higher-order address signal is generated by output of the A17, and the first bit in the first higher-order address signal is generated by output by the A16. A value of the first higher-order address signal may be "00", "01", "10", or "11".

After receiving the first chip select signal and the first higher-order address signal, the first level buffer chip determines the target second level buffer chip from the second level buffer chip according to the first chip select signal and the first higher-order address signal. Specifically, a mapping relationship for mapping the first higher-order address signal and the first chip select signal to the second chip select signal is preset. For example, the mapping relationship may be a truth table. The first level buffer chip generates coding code according to the mapping relationship, and stores the coding code in the first level buffer chip. After receiving the first chip select signal and the first higher-order address signal, the first level buffer chip performs coding processing on the first higher-order address signal and the first chip select signal by running the coding code to obtain the second chip select signal, and the first level buffer chip outputs the second chip select signal to the second level buffer chip to gate the target second level buffer chip from the second level buffer chip.

Table 1 lists a preset mapping relationship provided in this embodiment of the present invention. The first level buffer chip codes the first chip select signal and the first higher-order address signal according to a preset mapping relationship table to obtain a second chip select signal.

TABLE 1

| Input of first level buffer chip | | Output of first level buffer chip |
|---|---|---|
| First higher-order address signal [1:0] | First chip select signal [1:0] | Second chip select signal [7:0] |
| 00 | 01 | 11111110 |
| 00 | 10 | 11111101 |
| 01 | 01 | 11111011 |
| 01 | 10 | 11110111 |
| 10 | 01 | 11101111 |
| 10 | 10 | 11011111 |
| 11 | 01 | 10111111 |
| 11 | 10 | 01111111 |

The following code is coding code obtained according to Table 1:

CS2=Table [{HAddr, CS1} ], where CS1 is the first chip select signal,

HAddr is the first higher-order address signal,

CS2 is the second chip select signal, and

Table represents the mapping relationship shown in Table 1.

The foregoing coding rule is merely an example, and a person skilled in the art should know that the example cannot be taken as a condition that limits the present invention.

In this embodiment, when sending the memory access instruction, the lower-order address signal, the first chip select signal, and the first higher-order address signal to the first level buffer chip, the memory controller also sends a second higher-order address signal to the second level buffer chip. In this embodiment, a higher-order address signal of the memory controller may be selected from the remaining higher-order address signals as the second higher-order address signal, where the selected higher-order address signal is two bits. For example, the second higher-order address signal may be generated by output of an A19 and an A18 in the remaining higher-order address signal lines. The second bit in the second higher-order address signal is generated by output of the A19, and the first bit in the second higher-order address signal is generated by output by the A18. A value of the second higher-order address signal may be "00", "01", "10", or "11".

The memory controller sends the memory access instruction and the lower-order address signal to the first level buffer chip at first; then the first level buffer chip sends the memory access instruction, the lower-order address signal, and the second chip select signal obtained by coding the first chip select signal and the first higher-order address signal to the second level buffer chip; and the memory controller is connected to the second level buffer chip, and directly sends the second higher-order address signal to the second level buffer chip without being transferred by another buffer chip. Therefore, in a process of sending the second higher-order address signal to the second level buffer chip, the memory controller needs to perform delay processing on the second higher-order address signal to obtain the delayed address signal, and then sends the delayed address signal to the second level buffer chip, so that the memory access instruction, the lower-order address signal, and the second chip select signal, which pass the first level buffer chip, and the delayed address signal are simultaneously input to the second level buffer chip.

Optionally, when the memory controller performs delay processing on the second higher-order address signal, a delay circuit may be added in the memory controller, so that the memory controller is connected to the second level buffer chip by using the delay circuit. The delay circuit performs delay processing on the second higher-order address signal to obtain the delayed address signal, and then outputs the delayed address signal to the second level buffer chip. In this embodiment, the delay circuit is designed according to a delay parameter of the first level buffer chip. Alternatively, when a timer carried in the memory controller itself is used for timing, after timing duration of the timer reaches a preset delay time, the memory controller sends the second higher-order address signal to the second level buffer chip, where the preset delay time is set according to the delay parameter of the first level buffer chip. Alternatively, a connection line between the memory controller and the second level buffer chip is extended according to the delay parameter of the first level buffer chip to increase time for transmitting the second higher-order address signal, so that the delayed address signal, the memory access instruction, and the second chip select signal simultaneously reach the second level buffer chip.

In this embodiment, the first level buffer chip gates the target second level buffer chip according to the preset mapping relationship, the first chip select signal, and the first higher-order address signal. The first level buffer chip sends the memory access instruction, the second chip select signal, and the delayed address signal to the second level buffer chip. Correspondingly, the target second level buffer chip receives the memory access instruction, the second chip select signal, and the delayed address signal, and the target second level buffer chip determines the target memory module from the memory module according to the delayed address signal and the second chip select signal. A process in which the target second level buffer chip determines the target memory module from the memory module according to the delayed address signal and the second chip select signal, is similar to a process in which the first level buffer chip determines the target second level buffer chip from the second level buffer chip according to the first chip select signal and the first higher-order address signal. Reference may be made to the foregoing introduction of related content, and details are not described herein again.

Further, the target second level buffer chip determines the target memory chip from the target memory module according to the lower-order address signal. After determining the target memory chip, the target second level buffer chip acquires the corresponding target data from the target memory chip according to the memory access instruction.

Further, after acquiring the target data, the target second level buffer chip sends the target data to the first level buffer chip, and the first level buffer chip returns the target data to the memory controller.

In the memory access method provided in this embodiment, a memory controller sends a memory access instruction, a lower-order address signal, a first chip select signal, and a first higher-order address signal to a first level buffer chip, and performs delay processing on a second higher-order address signal to obtain a delayed address signal, and sends the delayed address signal to a second level buffer chip; the first level buffer chip gates a target second level buffer chip according to a preset mapping relationship, the first chip select signal, and the first higher-order address signal, and sends the memory access instruction and the lower-order address signal to the target second level buffer chip; and the target second level buffer chip determines a target memory module according to the delayed address signal and a second chip select signal, determines a target memory chip according to the lower-order address signal, acquires target data from the target memory chip according to the memory access instruction, and sends the target data to the memory controller by using the first level buffer chip. In this embodiment, the memory controller is connected to the first level buffer chip and the second level buffer chip, the first level buffer chip is cascaded with the second level buffer chip, and therefore a cascading manner of a system memory is changed to a tree-like topological form; the second level buffer chip can simultaneously receive signals, where one signal is sent by the memory controller and used to select the target memory module, another one signal that is sent by the first level buffer chip and used to gate the second level buffer chip. For the second level buffer chip, these two signals are no longer received in a series manner, thus converting series protocol to parallel protocol is not needed. This avoids a problem that a prior-art expanded a system memory needs to convert series protocol to parallel protocol, reduces time for accessing the system memory, and improves the memory access efficiency of the system memory.

In this embodiment, optionally, the second level buffer chip and the memory module in which a memory chip is integrated are integrated in a same integrated chip. Preferably, a load-reduced dual in-line memory module (Load Reduce Dual Inline Memory Module, LRDIMM for short) may be used as the foregoing integrated chip, where the buffer chip and the memory module are integrated in the LRDIMM. In this embodiment, the buffer chip integrated in the LRDIMM is used as the second level buffer chip, where an isolation memory buffer (Isolation Memory Buffer, iMB for short) chip may be used as the buffer chip in the LRDIMM, that is, the second level buffer chip. Further, a new buffer chip is added between the memory controller and the LRDIMM, where the new buffer chip is used as the first level buffer chip in this embodiment. Preferably, an iMB chip may also be used as the first level buffer chip. For a composition principle of the LRDIMM, reference may be made to a record of related content in the prior art, and details are not described herein again.

In this embodiment, a problem that an existing LRDIMM cannot be cascaded is solved by adding the first level buffer chip and a delayed address signal line between the memory controller and the LRDIMM, thereby achieving multi-level cascading of the LRDIMM, and further improving a memory capacity of the system memory.

Figure 3:
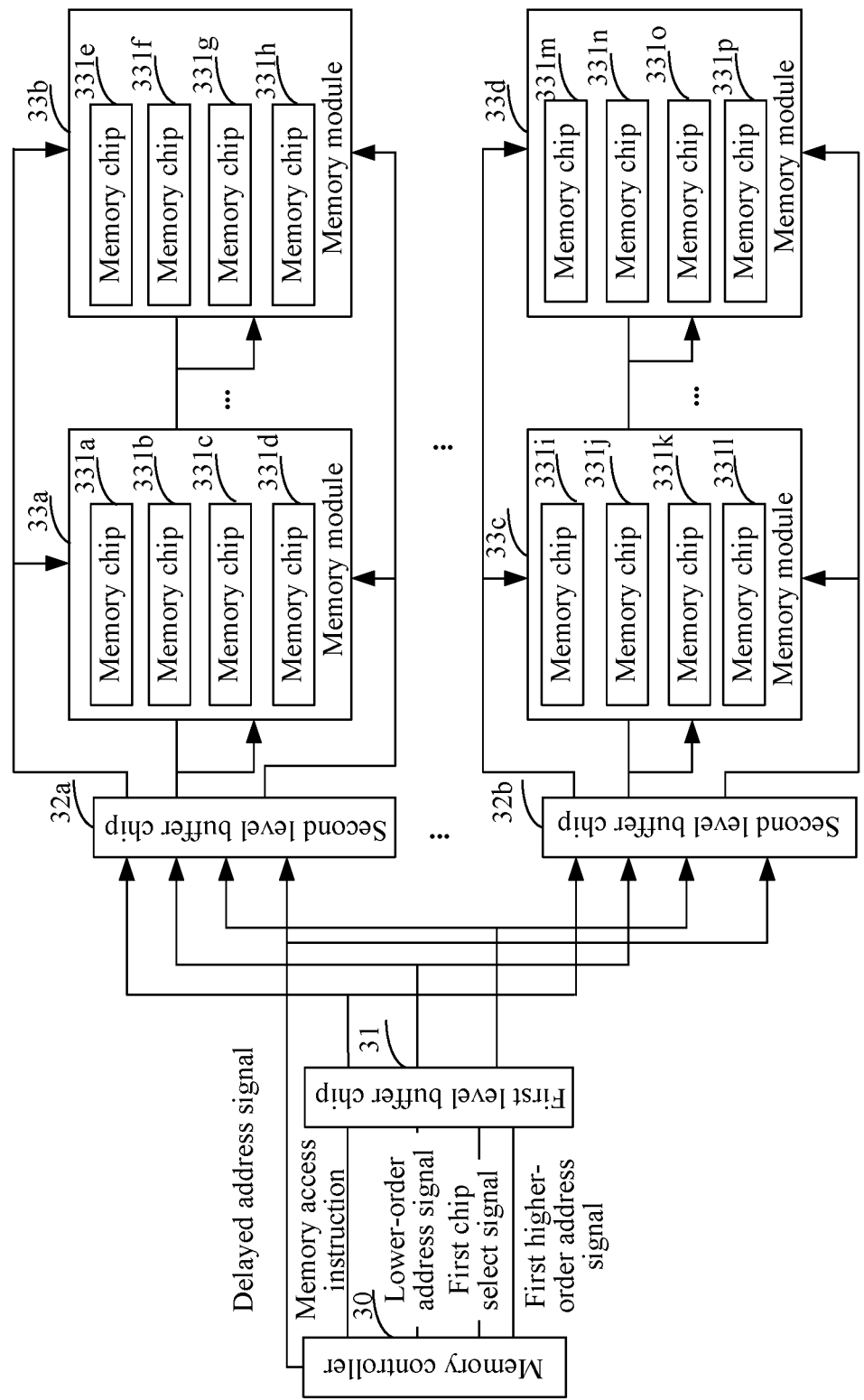
FIG. 3 is a schematic structural diagram of a memory system according to an embodiment of the present invention.

FIG. 3 is a schematic structural diagram of a memory system according to an embodiment of the present invention. As shown in FIG. 3, the memory system includes: a memory controller 30, a first level buffer chip 31, at least one second level buffer chip 32 (illustrated as second level buffer chips 32a-b), and at least one memory module 33 (illustrated as one memory modules 33a-d). The memory controller 30 is connected to the first level buffer chip 31 and each second level buffer chip 32a-b, the first level buffer chip 31 is cascaded with the second level buffer chip 32, each second level buffer chip 32a-b is separately connected to at least one memory module 33a-d, and the memory module 33 includes at least one memory chip 331 (illustrated as memory chips 331a-p). In the description of this figure, a singular reference number (without alphabetic suffix) may be used to reference the corresponding "at least one" element, although multiple elements are illustrated in this example.

When the memory controller 30 needs to access data stored in the memory module 33, the memory controller 30 sends a memory access instruction, a lower-order address signal, a first chip select signal, and a first higher-order address signal to the first level buffer chip 31. The first chip select signal and the first higher-order address signal are used to identify a target second level buffer chip from the second level buffer chip 32. In this embodiment, in order to distinguish the target second level buffer chip from another chip in the second level buffer chip, a number of the target second level buffer chip is defined as 320. The lower-order address signal is used to identify a target memory chip in a target memory module. Actually, the memory controller 30 generally has only 2 to 4 chip select signal lines. In this situation in which the buffer chips are cascaded, generally, the chip select signal lines of the memory controller 30 cannot meet a need for expanding a system memory. Because generally a quantity of address signal lines of the memory controller 30 is greater than that of address signal lines of a buffer chip, a higher-order address signal output by higher-order address signal lines of the memory controller 30 can be used as a chip select signal to implement multi-level cascading of the buffer chip, thereby achieving an objective of expanding the system memory. In this embodiment, a chip select signal CS output by an actual chip select signal line of the memory controller 30 is used as the first chip select signal. Only one chip select signal line is gated in a group of the chip select signal lines, and usually a low level is used as the chip select signal for gating the buffer chip. For example, in the group of chip select signals, a signal output by the only one chip select signal line is "0", and signals output by the remaining chip select signal lines are all 1'. In this embodiment, the memory controller selects two chip select signal lines, thus the first chip select signal is two bits, and a value of the first chip select signal is "01" or "10".

Generally, an address signal of a buffer chip is 16 bits. Address signal lines A0 to A15 of the memory controller 30 may be connected to address signal lines A0 to A15 of the first level buffer chip 31; specifically, the address signal lines A0 to A15 of the memory controller are connected to pins of the address signal lines A0 to A15 of the first level buffer chip. The address signal lines A0 to A15 of the first level buffer chip are connected to pins of address signal lines A0 to A15 of the second level buffer chip. The memory controller 30 uses output of the A0 to A15 of the memory controller as the lower-order address signal, and inputs the lower-order address signal to the first level buffer chip 31, where the lower-order address signal is formed by the output of the A0 to A15. A signal output by each address signal line represents a different bit in one address signal. For example, an output of the address signal line A0 represents the first bit in the address signal, that is, the lowest-order bit. An output of the address signal line A15 represents the sixteenth bit in the address signal, that is, the highest-order bit. The signal output by each address signal line is "0" or "1". For example, when the memory controller needs to access an address "2", a lower-order address signal that needs to be output is "0000000000000010", that is, the address signal line A1 outputs "1", and the remaining address signal lines A15 to A2 and A0 all output "0".

Further, some address signal lines are selected from the remaining higher-order address signal lines of the memory controller 30, and output of the selected address signal lines is used as the first higher-order address signal. In this embodiment, a higher-order address signal may be selected from the remaining higher-order address signals as the first higher-order address signal, where the higher-order address signal is two bits. For example, the first higher-order address signal may be generated by output of an A17 and an A16 in the remaining higher-order address signal lines. The second bit in the first higher-order address signal is generated by output of the A17, and the first bit in the first higher-order address signal is generated by output by the A16. A value of the first higher-order address signal may be "00", "01", "10", or "11".

After receiving the first chip select signal and the first higher-order address signal, the first level buffer chip 31 determines the target second level buffer chip 320 from all second level buffer chips 32 according to the first chip select signal and the first higher-order address signal. Specifically, a mapping relationship among the first higher-order address signal, the first chip select signal, and the second chip select signal is preset. For example, the mapping relationship may be a truth table. The first level buffer chip 31 generates coding code according to the mapping relationship, and stores the coding code in the first level buffer chip 31. After receiving the first chip select signal and the first higher-order address signal, the first level buffer chip 31 performs coding processing on the first higher-order address signal and the first chip select signal by running the coding code to obtain a second chip select signal; further, the first level buffer chip 31 outputs the second chip select signal to each second level buffer chip 32 to gate the target second level buffer chip 320 from the second level buffer chip 32. For a process in which the first level buffer chip 31 obtains the second chip select signal according to the preset mapping relationship, the first chip select signal, and the first higher-order address signal, reference may be made to Table 1 in the foregoing embodiment and a record of related content, and details are not described herein again.

In this embodiment, when the memory controller 30 sends the memory access instruction, the lower-order address signal, the first chip select signal, and the first higher-order address signal to the first level buffer chip 31, the memory controller 30 also sends a second higher-order address signal to the second level buffer chip 32. In this embodiment, the memory controller 30 may select a higher-order address signal from the remaining higher-order address signals as the second higher-order address signal, where the selected higher-order address signal is two bits. For example, the second higher-order address signal may be generated by output of an A19 and an A18 in the remaining higher-order address signal lines. The second bit in the second higher-order address signal is generated by output of the A19, and the first bit in the second higher-order address signal is generated by output by the A18. A value of the second higher-order address signal may be "00", "01", "10", or "11".

The memory controller 30 sends the memory access instruction and the lower-order address signal to the first level buffer chip 31 at first; then the first level buffer chip 31 sends the memory access instruction, the lower-order address signal, and the second chip select signal obtained by coding the first chip select signal and the first higher-order address signal to the second level buffer chip 32. The memory controller 30 is connected to the second level buffer chip 32, and directly sends the second higher-order address signal to the second level buffer chip 32 without transfer by another buffer chip. Therefore, in a process of sending the second higher-order address signal to the second level buffer chip 32, the memory controller 30 needs to perform delay processing on the second higher-order address signal to obtain a delayed address signal, and then send the delayed address signal to the second level buffer chip 32, so that the memory access instruction, the lower-order address signal, and the second chip select signal, which pass the first level buffer chip, and the delayed address signal are simultaneously input to the second level buffer chip 32.

Optionally, when the memory controller 30 performs delay processing on the second higher-order address signal, a delay circuit may be added in the memory controller 30, so that the memory controller is connected to the second level buffer chip 32 by using the delay circuit. The delay circuit performs delay processing on the second higher-order address signal to obtain the delayed address signal, and then the delay circuit outputs the delayed address signal to the second level buffer chip 32. In this embodiment, the delay circuit is designed according to a delay parameter of the first level buffer chip 31. Alternatively, when a timer carried in the memory controller 30 itself is used for timing, after timing duration of the timer reaches a preset delay time, the memory controller 30 sends the second higher-order address signal to the second level buffer chip 32, where the preset delay time is set according to the delay parameter of the first level buffer chip. Alternatively, a connection line between the memory controller 30 and the second level buffer chip 32 is extended according to a delay parameter of the first level buffer chip 31 to increase time for transmitting the second higher-order address signal, so that the delayed address signal, the memory access instruction, and the second chip select signal simultaneously reach the second level buffer chip 32.

In this embodiment, the first level buffer chip 31 gates the target second level buffer chip 320 according to the preset mapping relationship, the first chip select signal, and the first higher-order address signal. The first level buffer chip 31 sends the memory access instruction, the second chip select signal, and the delayed address signal to the second level buffer chip 32. Correspondingly, the target second level buffer chip 320 receives the memory access instruction, the second chip select signal, and the delayed address signal, and the target second level buffer chip 320 determines the target memory module from the memory module 33 according to the delayed address signal and the second chip select signal. In this embodiment, in order to distinguish the target memory module from another memory module, a number of the target memory module is defined as 330. A process in which the target second level buffer chip 320 determines the target memory module from the memory module according to the delayed address signal and the second chip select signal, is similar to a process in which the first level buffer chip 31 determines the target second level buffer chip 320 from the second level buffer chip 32 according to the first chip select signal and the first higher-order address signal. Reference may be made to the foregoing introduction of related content, and details are not described herein again.

Further, the target second level buffer chip 320 determines the target memory chip from the target memory module 330 according to the lower-order address signal. In this embodiment, each memory module 33 includes at least one memory chip 331. In order to distinguish the target memory module from another memory module, a number of the target memory chip is defined as 3310. After determining the target memory chip 3310, the target second level buffer chip 320 acquires corresponding target data from the target memory chip 3310 according to the memory access instruction.

Further, after acquiring the target data, the target second level buffer chip 320 sends the target data to the first level buffer chip 31, and the first level buffer chip 31 returns the target data to the memory controller 30.

In the memory system provided in this embodiment, a memory controller sends a memory access instruction, a lower-order address signal, a first chip select signal, and a first higher-order address signal to a first level buffer chip, performs delay processing on a second higher-order address signal to obtain a delayed address signal, and sends the delayed address signal to a second level buffer chip; the first level buffer chip gates a target second level buffer chip according to a preset mapping relationship, the first chip select signal, and the first higher-order address signal, and sends the memory access instruction and the lower-order address signal to the target second level buffer chip; and the target second level buffer chip determines a target memory module according to the delayed address signal and a second chip select signal, determines a target memory chip according to the lower-order address signal, acquires target data from the target memory chip according to the memory access instruction, and sends the target data to the memory controller by using the first level buffer chip. In this embodiment, the memory controller is connected to the first level buffer chip and the second level buffer chip, the first level buffer chip is cascaded with the second level buffer chip, and therefore a cascading manner of a system memory is changed to a tree-like topological form; the second level buffer chip can simultaneously receive signals, where a signal is sent by the memory controller and used to select the target memory module, and another signal is sent by the first level buffer chip and used to gate the second level buffer chip. For the second level buffer chip, these two signals are no longer received in a series manner, thus converting series protocol to parallel protocol is not needed. This avoids a problem that an existing expanded a system memory needs to convert the series protocol to the parallel protocol, reduces time for accessing the system memory, and improves the memory access efficiency of the system memory.

Figure 4:
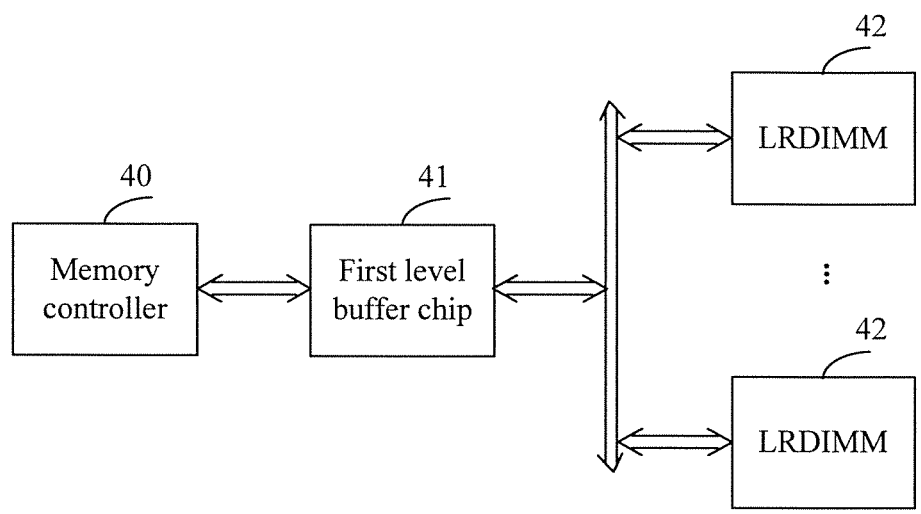
FIG. 4 is a schematic structural diagram of a memory system based on an LRDIMM according to an embodiment of the present invention.

FIG. 4 is a schematic structural diagram of a memory system based on an LRDIMM chip according to an embodiment of the present invention. As shown in FIG. 4, the memory system includes: a memory controller 40, a first level buffer chip 41, and at least one LRDIMM 42. An iMB chip and a memory module are integrated in the LRDIMM 42, and the memory module includes at least one memory chip. In this embodiment, the iMB chip in the LRDIMM 42 is used as a second level buffer chip 32 in the foregoing embodiment, and the memory module in the LRDIMM 42 is used as a memory module 33 in the foregoing embodiment. For a composition principle of the LRDIMM integrated chip 42, reference may be made to a record of related content in the prior art, and details are not described herein again. Further, a new buffer chip is added between the memory controller 40 and the LRDIMM 42, where the new buffer chip is used as the first level buffer chip 41. Preferably, an iMB chip may also be used as the first level buffer chip 41.

For an interaction relationship and a connection relationship among the memory controller 40, the first level buffer chip 41, and the LRDIMM 42, reference may be made to a record of related content in the foregoing embodiments, and details are not described herein again.

Optionally, in specific implementation, if the memory controller 40, the first level buffer chip 41, and the LRDIMM 42 are independently implemented, the memory controller 40, the first level buffer chip 41, and the LRDIMM 42 may be mutually connected and complete mutual communication, by using a bus. The memory controller 40 may be a central processing unit (Central Processing Unit, CPU for short), or an application specific integrated circuit (Application Specific Integrated Circuit, ASIC for short), or is configured as one or more integrated circuits for implementing this embodiment of the present invention. The bus may be a DDR bus or the like. The bus may include an address bus, a data bus, a control bus, and the like. For ease of illustration, only one bold line is used in FIG. 4 to represent the bus, which however does not mean that there is only one bus or only one type of bus.

Optionally, in specific implementation, if the memory controller 40, the first level buffer chip 41, and the LRDIMM 42 are integrated in one chip for implementation, the memory controller 40, the first level buffer chip 41, and the LRDIMM 42 can complete mutual communication by using an internal interface.

In the memory system provided in this embodiment, the memory controller 40 is connected to the first level buffer chip 41 and the LRDIMM 42, the first level buffer chip 41 is cascaded with the iMB chip in the LRDIMM 42; and therefore a cascading manner of the LRDIMM 42 is changed to a tree-like topological form; the LRDIMM 42 can simultaneously receive signals, where a signal is sent by the memory controller 40 and used to select a target memory module, and another signal is sent by the first level buffer chip 41 and used to gate the LRDIMM 42. For the LRDIMM 42, these two signals are no longer received in a series manner, thus converting series protocol to parallel protocol is not needed. This avoids a problem that an existing expanded system memory needs to convert series protocol to parallel protocol, reduces time for accessing a system memory, and improves the memory access efficiency of the system memory.

Further, in this embodiment, a problem that an existing LRDIMM cannot be cascaded is solved by adding the first level buffer chip 41 and a delayed address signal line between the memory controller 40 and the LRDIMM 42, multi-level cascading of the LRDIMM is implemented, and a memory capacity of the system memory is further improved.

Further, in this embodiment, in a process of implementing cascading of the LRDIMM 42, the memory capacity of the memory system can be improved by only making a simple modification to the memory controller 40. In addition, in the foregoing cascading of the LRDIMM 42, neither the first level buffer chip 41 nor the LRDIMM 42 needs to be modified, which reduces complexity of integrating a chip and therefore achieves an objective of reducing costs.

Finally, it should be noted that the foregoing embodiments are merely intended for describing the technical solutions of the present invention other than limiting the present invention. Although the present invention is described in detail with reference to the foregoing embodiments, a person of ordinary skill in the art should understand that he may still make modifications to the technical solutions described in the foregoing embodiments, or make equivalent replacements to some or all the technical features thereof, without departing from the spirit and scope of the technical solutions of the embodiments of the present invention.

What is claimed is:

1. A memory access method, comprising:
sending, by a memory controller, a memory access instruction, a lower-order address signal, a first chip select signal, and a first higher-order address signal to a first level buffer chip, performing delay processing on a second higher-order address signal to obtain a delayed address signal, and sending the delayed address signal to a second level buffer chip, wherein:
the first level buffer chip is cascaded with the second level buffer chip,
the second level buffer chip is connected to at least one memory module, wherein the at least one memory module comprises at least one memory chip, the first chip select signal and the first higher-order address signal are used to identify a target second level buffer chip in the second level buffer chip, and the lower-order address signal is used to identify a target memory chip in a target memory module;

outputting, by the first level buffer chip, a second chip select signal to the second level buffer chip according to a preset mapping relationship, the first chip select signal, and the first higher-order address signal to gate the target second level buffer chip, and sending the memory access instruction and the lower-order address signal to the target second level buffer chip, wherein:
the second level buffer chip comprises at least one buffer chip, and
the target second level buffer chip is a buffer chip that is gated by using the second chip select signal and is in the second level buffer chip;

determining, by the target second level buffer chip, the target memory module from the at least one memory module according to the delayed address signal and the second chip select signal, and determining the target memory chip from the target memory module according to the lower-order address signal, wherein the delayed address signal and the second chip select signal are used to identify the target memory module in the at least one memory module; and acquiring, by the target second level buffer chip, target data from the target memory chip according to the memory access instruction, and sending the target data to the memory controller by using the first level buffer chip.

2. The memory access method according to claim 1, wherein performing, by the memory controller, delay processing on a second higher-order address signal to obtain a delayed address signal comprises:
performing, by the memory controller, delay processing on the second higher-order address signal according to a delay parameter of the first level buffer chip to obtain the delayed address signal.

3. The memory access method according to claim 1, wherein outputting, by the first level buffer chip, a second chip select signal to the second level buffer chip according to a preset mapping relationship, the first chip select signal, and the first higher-order address signal to gate the target second level buffer chip comprises:
generating, by the first level buffer chip, code according to the mapping relationship;
coding, by the first level buffer chip, the first chip select signal and the first higher-order address signal by using the code, so as to obtain the second chip select signal; and
outputting, by the first level buffer chip, the second chip select signal to the second level buffer chip to gate the target second level buffer chip.

4. A memory system, comprising:
a memory controller, a first level buffer chip, and at least one second level buffer chip, wherein the memory controller is connected to the first level buffer chip and the at least one second level buffer chip, the first level buffer chip is cascaded with the at least one second level buffer chip, the at least one second level buffer chip is connected to at least one memory module, and the at least one memory module comprises at least one memory chip;

wherein the memory controller is configured to:
send a memory access instruction, a lower-order address signal, a first chip select signal, and a first higher-order address signal to the first level buffer chip,
perform delay processing on a second higher-order address signal to obtain a delayed address signal,
send the delayed address signal to the at least one second level buffer chip, and
receive target data returned by the first level buffer chip, wherein the first chip select signal and the first higher-order address signal are used to identify a target second level buffer chip in the at least one second level buffer chip, and the lower-order address signal is used to identify a target memory chip in a target memory module;

wherein the first level buffer chip is configured to:
receive the memory access instruction, the lower-order address signal, the first chip select signal, and the first higher-order address signal,
output a second chip select signal to the at least one second level buffer chip according to a preset mapping relationship, the first chip select signal, and the first higher-order address signal to gate the target second level buffer chip,
send the memory access instruction and the lower-order address signal to the target second level buffer chip,
receive the target data returned by the target second level buffer chip, and
send the target data to the memory controller, wherein the at least one second level buffer chip comprises at least one buffer chip, and the target second level buffer chip is a buffer chip that is gated by using the second chip select signal and is in the at least one second level buffer chip; and wherein the target second level buffer chip is configured to:
receive the memory access instruction, the lower-order address signal, the delayed address signal, and the second chip select signal,
determine the target memory module from the at least one memory module according to the delayed address signal and the second chip select signal,
determine the target memory chip from the target memory module according to the lower-order address signal,
acquire the target data from the target memory chip according to the memory access instruction, and
send the target data to the first level buffer chip, wherein the delayed address signal and the second chip select signal are used to identify the target memory module in the at least one memory module.

5. The memory system according to claim 4, wherein the memory controller is configured to:
perform delay processing on the second higher-order address signal according to a delay parameter of the first level buffer chip to obtain the delayed address signal.

6. The memory system according to claim 4, wherein the first level buffer chip is configured to:
generate code according to the mapping relationship; code the first chip select signal and the first higher-order address signal by using the code, so as to obtain the second chip select signal; and output the second chip select signal to the at least one second level buffer chip to gate the target second level buffer chip.

7. The memory system according to claim 4, wherein the first level buffer chip is an isolation memory buffer (iMB) chip.

8. The memory system according to claim 4, wherein a load-reduced dual in-line (LRDIMM) comprises an isolation memory buffer (iMB) chip and the at least one memory module, the iMB chip in the LRDIMM is the at least one second level buffer chip.

* * * * *